(12) United States Patent
Campidell et al.

(10) Patent No.: US 7,723,710 B2
(45) Date of Patent: May 25, 2010

(54) SYSTEM AND METHOD INCLUDING A PREALIGNER

(75) Inventors: Josef Campidell, Villach (AT); Robert Wistrela, Klagenfurt (AT); Horst Kittner, Klagenfurt (AT); John Cooper, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/022,611

(22) Filed: Jan. 30, 2008

(65) Prior Publication Data

US 2009/0189054 A1   Jul. 30, 2009

(51) Int. Cl.
*G01N 21/86* (2006.01)
(52) U.S. Cl. .............. 250/559.44; 250/559.3; 250/234; 250/548; 356/400; 414/776
(58) Field of Classification Search .......... 250/548, 250/234, 236, 559.3, 559.4, 559.44, 559.46; 356/399–401; 414/776, 780, 783, 785, 936
See application file for complete search history.

(56) References Cited

U.S. PATENT DOCUMENTS

| 5,513,948 | A | * | 5/1996 | Bacchi et al. ............... 414/783 |
| 5,965,303 | A | | 10/1999 | Huang |
| 6,319,638 | B1 | | 11/2001 | Inomoto |

* cited by examiner

*Primary Examiner*—Kevin Pyo
(74) *Attorney, Agent, or Firm*—Dicke, Billig & Czaja, PLLC

(57) ABSTRACT

A system and method for prealigning a substrate. One embodiment provides a rotor configured to rotate a carrier around a rotation axis in response to a rotation signal. The carrier includes a main surface substantially perpendicular to the rotation axis. The substrate is disposable on the carrier. The substrate includes a main surface and a mark such that an orientation of the substrate with respect to the rotation axis is detectable. An electromagnetic radiation source is configured to illuminate the main surface of the substrate with electromagnetic radiation. An optical/electrical converter is responsive to the electromagnetic radiation reflected back from the main surface, detecting the mark of the substrate and providing a sensing signal. A controller is configured to receive the sensing signal and providing the rotation signal.

25 Claims, 10 Drawing Sheets

SYSTEM AND METHOD INCLUDING A PREALIGNER

BACKGROUND

Many modern devices are based on integrated-circuit technology and other thin-film technologies. Apart from integrated circuits already mentioned, further examples of such devices are micromechanical devices and sensors for biological, chemical or physical effects. Of course, corresponding micromechanical devices or sensors may be combined on a substrate with integrated circuits so as to integrate for example not only the actual sensor, but also the respective evaluating electronics or pre-processing circuits into the substrate. Integrated acceleration sensors or pressure sensors are examples of this.

Such devices and integrated circuits are typically manufactured in complex manufacturing processes using different thin-film technologies. Deposition processes where, among other things, epitaxial, monocrystalline, polycrystalline or amorphous layers are deposited, implantation processes where a semiconductor material is doped or a semiconductor material's doping is altered, annealing processes and activating processes where the substrate, intermediate or product is subjected to a pre-defined atmosphere and/or temperature profile, patterning processes which may include exposing processes and etching processes and in which patterns are defined for potentially following processes are among the different manufacturing processes. Patterning processes may further include applying a resist, exposure to electromagnetic radiation or particles, one or several developing processes and, maybe, one or more thermal treatment processes or other intermediate processes.

Some of these processes used when manufacturing integrated circuits or other devices as mentioned above appear to make aligning the intermediates with regard to further processes, for instance patterning advisable. Additionally, aligning substrates or intermediates may be advisable for the simple reason that the finished devices may be based on special features depending on the crystal orientation of the substrates, so that aligning the substrate to be processed as precisely as possible may be recommendable even for the first process process.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 4b illustrates a schematic cross-sectional drawing of the arrangement illustrated in FIG. 4a.

DETAILED DESCRIPTION

Figure 1:
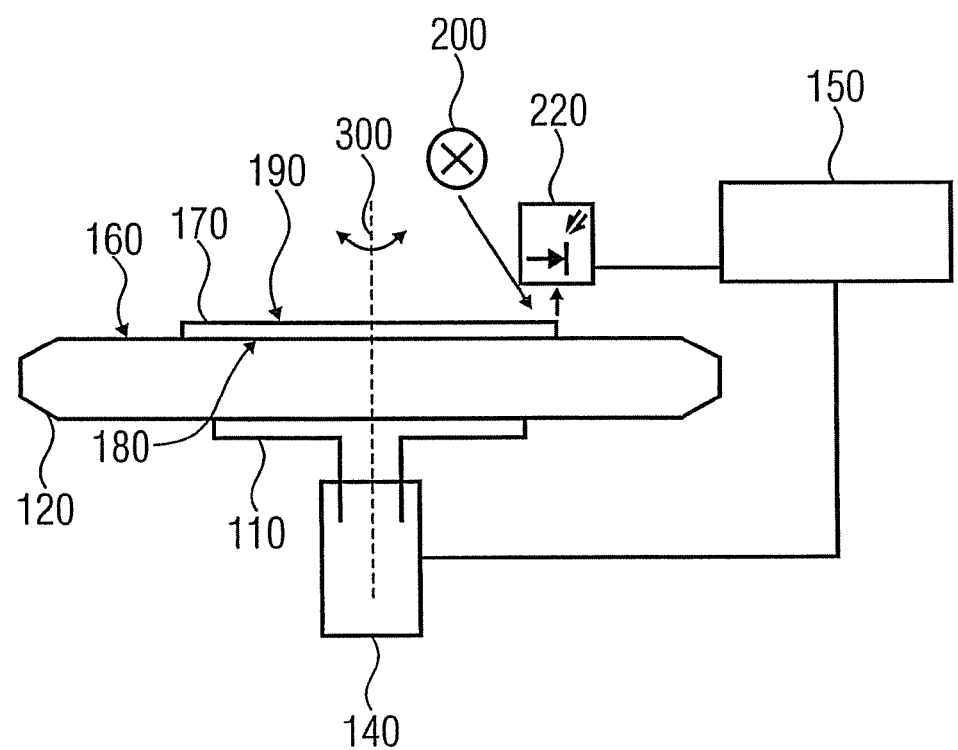
FIG. 1 illustrates a schematic illustration of a prealigner according to a first embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

A first embodiment of a prealigner will be described below referring to FIGS. 1 to 10.

Many electrical, electronic, micromechanical and other devices and sensors are manufactured employing very different thin-film processes and thin-film technologies. Here, these devices and/or intermediates thereof are given structural features which may be essential for the mode of functioning of the future devices or sensors. Defining pads or bond pads, trench patterns, doping profiles or other spatial arrangements of structures and objects are examples of such structural features. In many cases, the future functionality of the device is not least dependent on these individual structural features to be arranged relative to one another in a certain manner, or relative to a crystal orientation of a substrate.

In some thin-film processes, in particular those where corresponding structural features are defined or prepared, aligning the intermediate and/or the substrate underlying the intermediate is advisable. Since a final product and an intermediate here are usually built on a substrate and include same, the terms substrate, product and intermediate will largely be used as synonyms in the further course of the description.

So-called mix & match processes where several exposing processes are performed, between which further processes (like for example etching processes and the like) may be performed, are examples of processes where aligning the substrate is frequently advisable. Thus, in many cases, in particular more complex devices require a plurality of exposing processes where different patterns are prepared and defined. In the case of vertical trench transistors where the future gate electrodes are arranged in the trenches, it is frequently appropriate to produce the trenches based on a different photolithographically prepared resist pattern than the doping profiles for the regions between the trenches (active regions). Also, in the case of IGBT (insulated gate bipolar transistor) structures different structures are typically prepared in different manufacturing processes which appear to make mutual alignment at least advisable, if not necessary. In the case of other devices, like for example field-effect transistors, bipolar transistors, diodes, capacitors and most different kinds of sensor elements (for example magnetoresistive sensor elements), too, aligning may be advisable.

These examples illustrate that there is a demand for aligning the substrates, i.e. also the intermediates, in more complex devices based on thin-film processes. Apart from this basic requirement, it is also desirable to allow substrate aligning or prealigning to be performed as quick as possible and independently of processes to be performed directly after that to avoid potential delays of the entire manufacturing process. In addition, it may also be desirable to prealign or align a substrate more securely and more reliably so as to avoid or at least reduce interruptions in the process flow. In other words, in many applications there is a demand for aligning or prealigning a substrate under conditions suitable for manufacturing and production to be able to make use of the enormous economic potential behind it.

FIG. 1 illustrates a schematic illustration of a first embodiment of a prealigner 100 using the structure of which the basic mode of functioning of embodiments will be illustrated and explained. The prealigner 100 includes a rotor 110 on which a carrier 120 may be placed or mounted in order for the rotor 110 to be able to rotate the carrier 120 around a rotation axis 130. The rotation axis 130 here is referred to as the first axis. The rotor 110 is connected to a driving unit 140, i.e. a DC motor or stepper motor, able to apply a torque to the rotor 110 to set same to rotate. The driving unit 140 is coupled to a controller 150 which is also referred to as control circuit or control unit and which is able to provide the driving unit 140 with a rotation signal used as a drive signal.

The carrier 120 includes a main surface 160 on which a substrate 170 is disposable. The substrate 170 here with its backside 180 is in direct or via a glue layer, attachment or another mounting layer indirect connection to the main surface 160 of the carrier 120. Of course, depending on the specific implementation, the substrate 170 with its backside 180 may also be in indirect connection to the main surface 160 of the carrier 120 by introducing modules potentially belonging to the carrier. Put differently, this means that the backside 180 of the substrate 170 faces the main surface 160 of the carrier 120.

Additionally, the substrate 170 includes a main surface 190 facing away from the backside 180. The two main surfaces 160 and 190 of the carrier 120 and the substrate 170, respectively, thus basically have the same direction. The surface normals or normals (direction perpendicular to an area or surface) of the two main surfaces 160, 190 thus are essentially parallel, wherein, in the present description, two essentially parallel, normal axes or directions are to be taken as enclosing an angle smaller than or equal to 15° or, in other implementations, smaller than or equal to 5°. The rotation axis 130 thus also is essentially parallel to the normal to surface of the carrier 120 and that of the substrate 170.

The prealigner 100 additionally includes an electromagnetic radiation source 200 which in FIG. 1 is, in a simplified manner, indicated as a light source. The electromagnetic radiation source 200 here is arranged or formed with regard to the substrate 170 and the carrier 120 such that it can illuminate the main surface 190 of the substrate 170 and the main surface 160 of the carrier 120, respectively, with electromagnetic radiation. The electromagnetic radiation source 200 also referred to as radiation source is disposed, at least with regard to an exit aperture, or comparable component above the main surfaces 160, 190 of the carrier 120 and the substrate 170, as is also illustrated schematically in FIG. 1.

Furthermore, the prealigner 100 includes an optical/electrical converter 210 which is also, at least with regard to an entry aperture for electromagnetic radiation reflected back from the substrate 170 and/or the carrier 120, arranged above the main surfaces 160, 190. In FIG. 1, this is illustrated schematically by the optical/electrical converter 210, like the radiation source 200, being disposed above the two main surfaces 160, 190. In particular, the optical/electrical converter 210 is disposed on the side of the substrate 170 facing away from the backside 180 of the substrate 170. Depending on the specific implementation, the optical/electrical converter 210, too, may be disposed at a different position than directly above the substrate 170, provided it is able to detect the electromagnetic radiation of the radiation source 200 reflected back from the substrate 170 and/or the carrier 120.

In order to allow such a mark to be detected, depending on the specific implementation of the prealigner 100, the main surface 160 of the carrier may be matted, blackened, polished or processed in another manner with regard to its reflectivity or its transmitivity when the carrier 120 is produced from an optically transmissive material.

The optical/electrical converter 210 is additionally coupled to the controller 150 so that the controller 150 is able to receive a sensing signal from the optical/electrical converter 210. On the basis of this sensing signal, the controller 150 is able to generate and output thereto the rotation signal for the driving unit 140. Additionally, the controller 150 may optionally also be coupled to the electromagnetic radiation source 200 for controlling.

The substrate 170 includes a mark allowing determining or making detectable an orientation of the substrate with regard to the rotation axis 130 or an axis shifted parallel thereto. Depending on the specific design of the substrate 170, there may be a plurality of different possible marks two possibilities of which will be discussed in greater detail referring to FIGS. 2a and 2b for the case of a wafer. However, as will be discussed in greater detail referring to FIGS. 2a and 2b, different marks may be employed here additionally.

During operation of the prealigner 100, responsive to a drive signal of the controller 150, the radiation source 200 may illuminate the main surface 190 of the substrate 170 and the main surface 160 of the carrier 120, respectively, with electromagnetic radiation. Depending on the specific design of the prealigner 100, the electromagnetic radiation may be monofrequent or broadband radiation. Additionally, depending on the specific design, it may be coherent radiation as is for example emitted by a laser, or non-coherent radiation. With regard to the frequencies or wavelengths, the electromagnetic radiation emitted by the radiation source 200 may be visible light, i.e. radiation including at least a part of the spectrum of visible light, infrared radiation, ultraviolet radiation or higher-energy radiation, like for example X-rays or gamma radiation.

In many embodiments in the form of a prealigner 100, the electromagnetic radiation emitted is visible light or infrared radiation, as can be generated by incandescent lamps, gas-discharge lamps, light-emitting diodes (LEDs), solid-state lamps, lasers, solid-state lasers or laser diodes. Additionally, ultraviolet (UV) radiation sources may also be employed, even if the substrate 170 and/or the corresponding intermediate is coated with a UV-sensitive resist, when the radiation emitted by the radiation source 200 is limited spatially to an edge region of the substrate 170 or limited to a frequency or wavelength range where the respective resist is not sensitive. When the resist with which the substrate 170 is coated is a i-line resist which is particularly sensitive to a wavelength of around 365 nm, it is basically possible to illuminate the substrate 170 by ultraviolet radiation in the region of the g-line (436 nm) or the h-line (405 nm), provided the resist does not have any sensitivity in these spectral ranges or only a sensitivity irrelevant for the overall process. Radiation of this kind may be generated using an Hg gas-discharge lamp and, maybe, other filters.

Of course, other radiation sources 200, like for example infrared light-emitting diodes (IR-LED), gas-discharge lamps, incandescent lamps or other radiation sources, may also be employed. For reasons of simplicity, these radiation sources 200 which may further include additional optical means in the form of mirrors, prisms, lenses, lens systems, filters and shutters, will also be referred to as light sources although they may not emit exclusively visible light or even no visible light at all. The terms light source, electromagnetic radiation source and radiation source may thus be used as synonyms in the present description.

Due to the arrangement of the radiation source 200 above the main surfaces 160, 190 of the substrate and the carrier 120 as described before, the substrate 170 and, maybe, the carrier 120 reflect electromagnetic radiation before same impinges on the optical/electrical converter 210. The radiation detected by the optical/electrical converter 210 depends not least on the reflectivity of the material in the optical path between the radiation source 200 and the optical/electrical converter 210. In particular the reflectivity of the substrate 170 and the reflectivity of the carrier 120 at the respective main surfaces 190, 160 thereof may play an important role here.

The reflectivity here does not only include a ratio of the portions of electromagnetic radiation from the radiation source 200 registered by the optical/electrical converter 210 to the radiation hitting the carrier 120 or the substrate 170 in the respective region. The reflectivity of the substrate 170, that of the carrier 120 and of further objects and materials in the optical path also include the type of reflection, the fact whether it is directional or diffuse, and an indication on the portion of the electromagnetic radiation detected by the optical/electrical converter 210 and that emitted by the radiation source 200 as mentioned above.

With regard to the main surface 190, the substrate 170 here typically has a reflectivity deviating from that of the mark or that of the carrier 120. Thus, the electromagnetic radiation detected by the optical/electrical converter 210 differs depending on whether it is reflected back from the main surface 190 of the substrate 170 or by the mark of the substrate 170 or the main surface 160 of the carrier 120 or a different material. When the substrate 170 passes below the optical/electrical converter 210 by a rotation of the carrier 120, ideally the electromagnetic radiation detected by the optical/electrical converter 210 changes when the mark indicating the orientation of the substrate 170 passes below the optical/electrical converter 210. Typically, the reflectivity of the main surface 190 of the substrate 170 is also altered by a resist layer for subsequent exposure such that the optical/electrical converter 210 is able to detect the mark of the substrate 170 in the geometry of the prealigner 100 outlined in FIG. 1.

When the intensity of the electromagnetic radiation detected by the optical/electrical converter 210 changes, which is also reflected in the sensing signal, the controller 150, on the basis of this change in intensity, is, for example, able to establish the point in time when the mark has passed the optical/electrical converter 210.

Depending on the specific design of one embodiment in the form of a prealigner 100, the controller 150 in this case may be implemented so as to output a control signal (rotation signal) to the drive unit 140, bringing a rotation of the rotor 110 with the carrier 120 and the substrate 170 mounted thereto to a halt. Additionally, the controller 150 may of course also generate a drive signal causing rotation of the rotor 110 in the opposite direction at a lower speed.

Additionally, further more complex localization patterns may be realized by the controller 150. As an example, with a rotation speed decreasing iteratively from iteration process to iteration process, with a respective change in the direction of rotation with regard to the rotation axis 130, an alignment or prealignment of the substrate relative to the mark of the substrate 170 can be achieved with regard to the position of the optical/electrical converter 210 which is in principle given by the positioning precision of the rotor 110, the sizes and the shapes of the mark of the substrate 170 and the resolution precision of the optical/electrical converter 210.

When the mark of the substrate 170 has been matched with the position of the optical/electrical converter 210, it is, for example, possible to remove, responsive to a transportation signal generated by the controller 150, the substrate 170 from the rotor 110 along with the carrier 120 and to take it, if necessary, to a corresponding process equipment. Such process equipment may, for example, be lithographic exposure equipment, like for example a stepper, i.e. projection exposing device. In this case, the substrate 170 may exemplarily be transported to a sample stage of the stepper together with the carrier 120 so that further processing in the form of exposure may be performed. Frequently, the sample stages of the steppers are not able to perform any orientation outside a certain angular range which is mostly limited tightly at all. Hardly any sample stage of a stepper is, for example, able to rotate the substrate by +/−30° or more. Frequently, the angular range concerned is limited to a few degrees, typically to less than 5°.

Additionally, aligning the substrate 170 completely using the sample stage would slow down the process flow unduly, since the time necessary for prealignment will no longer be available for the actual exposure in the stepper so that the throughput of the respective projection exposing unit compared to using a prealigner 100, as is schematically illustrated in FIG. 1, would decrease.

Depending on the specific design of one embodiment, irrespective of any original orientation of the substrate 170, the substrate 170 can be prealigned or aligned up to a precision determined by the specific design measures of the prealigner 100. This may require the rotor 110, together with the carrier 120 and the substrate 170, to exemplarily be rotatable around the rotation axis 130 by +/−180° with regard to any or a predetermined starting position or starting direction so that the rotor 110, together with the carrier 120 and the substrate 170, can be turned completely around the rotation axis 130 by the prealigner 100 at least once.

When the substrate 170 has more than one mark, for instance due to a corresponding symmetry of the crystal or different features, orienting may also, independently of an original orientation of the substrate 170, be achieved when the rotor 110, together with the carrier 120 and the substrate 170, is rotatable by a angular range smaller than +/−180°.

When the substrate 170 has a 2-fold symmetry with two marks offset by 180°, the rotatability of the rotor 110 and the carrier 120 of +/−90° or more can be sufficient to allow aligning or prealigning the substrate 170 irrespective of an original orientation thereof. Correspondingly, with a 4-fold symmetry and four symmetrically distributed marks, a rotatability of the rotor 110 of +/−45° may be sufficient to allow a corresponding alignment or prealignment of the substrate 170 irrespective of the original orientation thereof.

Embodiments, like, for example, the prealigner 100 illustrated in FIG. 1, are based on the finding that, apart from the basic possibility, an automated, quicker, more reliable alignment or prealignment of the substrate 170 which may also be less dependent on the further process flow is not least possible due to the fact that a mark altering the reflectivity of the substrate 170 is detected by disposing the electromagnetic radiation source 200 and the optical/electrical converter 210 with regard to the main surface 190 of the substrate 170 such that the optical/electrical converter 210 detects the electromagnetic radiation reflected back from the main surface 190 of the substrate 170.

Put differently, embodiments are based on the finding that the main surface 190 of a substrate 170 in particular has a reflectivity typically differing greatly from that of other components of the prealigner 100 due to the overall process flow in connection with which the substrate 170 is processed to result in the future device.

Sometimes, the reflectivity of the main surface 190 of the substrate 170 for example is very much greater than that of the main surface 160 of the carrier 120, since the main surface 190 of the substrate 170 is polished to be mirror-like in many processes. Before the actual manufacturing method, the substrate 170 is frequently polished such that inhomogeneities of the main surface 190 do not exceed a range of a few nanometers. In addition, polishing processes, like, for example, chemical-mechanical polishing (CMP), are used in the further process flow to achieve the intermediate to be planarized.

In one or more embodiments, a mark is made use of for orienting the substrate 170, which in connection with the carrier 120 and, maybe, other materials arranged in the optical path between the radiation source 200 and the optical/electrical converter 210 results in a different reflectivity of the electromagnetic radiation irradiated. Corresponding marks may directly influence the shape and/or the circumference of a substrate 170 so that the result is the different reflectivity of the mark due to the difference in reflectivity of the main surfaces 190, 160 of the substrate 170 on the one hand and of the carrier 120 on the other hand. In addition, however, it is basically also possible to use marks influencing the reflectivity of the substrate 170 directly. Examples of the latter cases may be generated by attacking the polished main surface 190 of the substrate in the outer region of the substrate 170 in a well-aimed manner by wet-chemical etching attacks to the surface appearance thereof. By using etching solutions which are at least partly anisotropic, a change in reflectivity detectable by the optical/electrical converter 210 can be achieved. Such a mark may be prepared photolithographically by protecting that part of the substrate not to be etched by a resist.

Depending on the specific design of the embodiments, the carrier here may be formed by matting, blackening, a suitable material selection (exemplarily glass), polishing or geometrical design such that the reflectivity of the electromagnetic radiation differs from that of the main surface of the substrate 190.

Figure 2A:
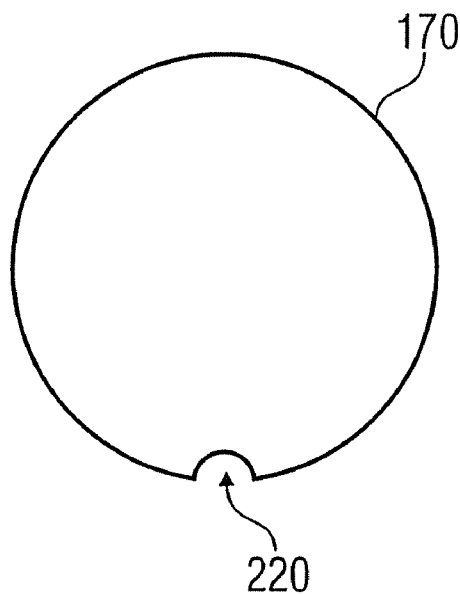
FIG. 2a illustrates a top view of a wafer including a notch.
Figure 2B:
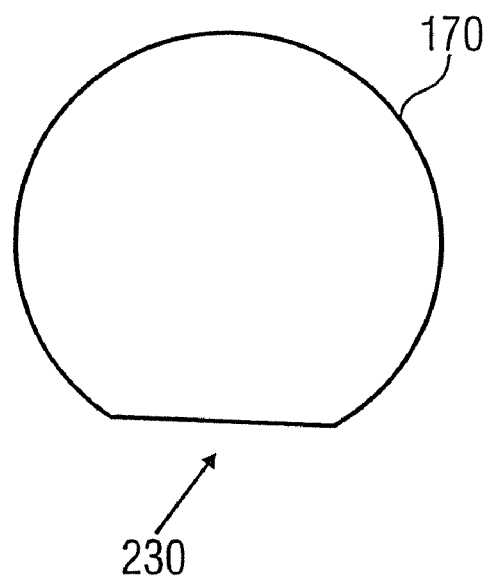
FIG. 2b illustrates a top view of a wafer including a flat.

FIGS. 2a and 2b illustrate two different embodiments of substrates 170 where the mark is given by the outer shape of the substrate 170. More explicitly, FIGS. 2a and 2b illustrate wafers as substrate 170, wherein in the case of the wafer 170 in FIG. 2a the orientation is marked by a notch. Differing from the semicircular shape of the notch 220 illustrated in FIG. 2a, it may of course also be defined to be wedge-shaped, V-shaped, rectangular, polygonal or defined by a different recess shape.

In the wafer 170 illustrated in FIG. 2b, the orientation is indicated by a flat 230 regarding the circular shape of the wafer 170. Thus, in the case of a silicon wafer (Si wafer) where the main surface 190 has a (100) orientation, the flat 230 may extend parallel or perpendicular to a <110> crystal direction. Correspondingly, the notch 220 of the wafer 170 of FIG. 2a may exemplarily be an <100> crystal direction or even a <110> crystal direction when the main surface 190 of the wafer 170 for example has an (100) orientation.

With regard to the dimensioning of the notch 220, it typically has a diameter and/or a characteristic length in the range between 0.5 mm and 5 mm when the wafer 170 is one having a diameter of approximately 200 mm (8 inches, 8"). A typical value for a notch 220 for a corresponding 8" wafer is in a range of around 1.5 mm.

Even if a mono-crystalline substrate 170, i.e. a basically circular substrate, has been discussed in the examples before as a wafer, poly-crystalline substrates, too, may include corresponding marks in the form of notches 220 or flats 230 to allow the wafers or substrates 170 to be oriented reproducibly in the case of a multi-process manufacturing method. In such a case, the respective marks do of course not necessarily indicate a crystal direction.

Furthermore, not only wafers, i.e. essentially circular substrates 170, can be provided with corresponding marks, but basically substrates having any shape may include marks detectable by an optical/electrical converter 210. Apart from wafers, rectangular, squared or polygonal substrates which include a corresponding outer shape and/or outer circumference deviation are frequently used. In the case of a squared or rectangular substrate, a corresponding notch may be milled into a longitudinal side or a corner may be altered by a round-off or a diagonal cut.

Depending on the specific design of a prealigner 100 according to one embodiment, substrates 170 of different thicknesses may also be used. Apart from substrates having typical thicknesses between 100 μm up to several millimeters, particularly thin substrates having thicknesses in the range between some 10 μm and 100 μm may also be employed. In the case of substrates having thicknesses in the range between 50 μm and 100 μm or 70 μm and 100 μm, it may, for example, be advisable for stabilizing purposes to glue them onto a carrier 120 made of glass.

In this case, the rotor 110 is able to rotate the glass carrier 120 together with the substrate 170 glued thereto. Depending on the specific design of the rotor 110, the carrier 120 in this case may be mounted to the rotor 110 by a vacuum or an electrostatic force. Of course, other mountings of the carrier 120 to the rotor 110, like mechanical ones, are also feasible.

When the substrate 170 is, for example, a silicon wafer and the radiation source 200 is a radiation source emitting infrared radiation or visible light, due to the typically polished main surface 190 of the wafer 170, the reflectivity for the respective radiation is very high, while the radiation may pass the carrier 120 basically unhindered. When the mark of the wafer 170 is a notch 220, as is illustrated in FIG. 2a, or a flat 230, as is illustrated in FIG. 2b, the optical/electrical converter 210 would detect a high intensity if the wafer 170 with its main surface 190 was below, and a low intensity if the notch 220 or the flat 230 was below the optical/electrical converter 210.

As will be discussed in greater detail in the further course of the present description, in this case even the glue protruding from between the wafer 170 and the glass carrier 120 will have a reflectivity which is considerable below that of the polished main surface 190 of the substrate 170. Even if it may have a reflectivity increased compared to the glass carrier 120 due to its high transparency, it is frequently considerably below the reflectivity of the main surface 190 of the wafer 170. Thus, using the optical/electrical transducer 210, the notch 220 or flat 230 of the wafer 170 may still be detected reliably when a thin layer of glue has entered the respective region.

For reasons of completeness, it seems appropriate here to mention that of course different materials than glass may be used for the carrier 120. It is possible for many thicknesses and types of substrates to use carriers 120 made of metal, as long as a difference detectable by the optical/electrical converter 210 with regard to the reflectivities of the main surface 190 of the substrate 170 and the reflectivity in the region of the mark which may also be influenced by the reflectivity of the carrier material 120 is guaranteed. Depending on the specific design, it may thus be advisable to change and/or to matt the carrier 120 with regard to its reflectivity, for example by etching or a different technology. Additionally, acrylic plastic (PMMA) or other plastics may basically be used for manufacturing the carrier as long as they are sufficiently compatible with the process chemicals of the entire process.

Additionally, it may optionally be possible in some embodiments to move the carrier 120 horizontally in a plane which is basically perpendicular to the rotation axis 130, to match the rotation axis 130 of the rotor 110 and a symmetry axis of the substrate 170. For this purpose, the rotor may be disposed to be shiftable in the respective level, either alone or together with the drive unit 140.

Before another embodiment in the form of a prealigner 100 will be described in connection with FIG. 3, it is at first to be pointed out that same or similar reference numerals will be used in the present description for objects, structures and units having same or similar functional characteristics and features. Additionally, in the further course of the description summarizing reference numerals will be used for objects, structures and units which occur several times in individual embodiments or several times in different embodiments, except when a specific structure, a specific object or a specific component is referred to. Corresponding parts of the description relating to different functional groups which, however, are similar or equal with regard to their function, may be interchanged and/or be supplemented by corresponding passages, unless specifically indicated to the contrary in order to be able to describe embodiments briefly.

Figure 3:
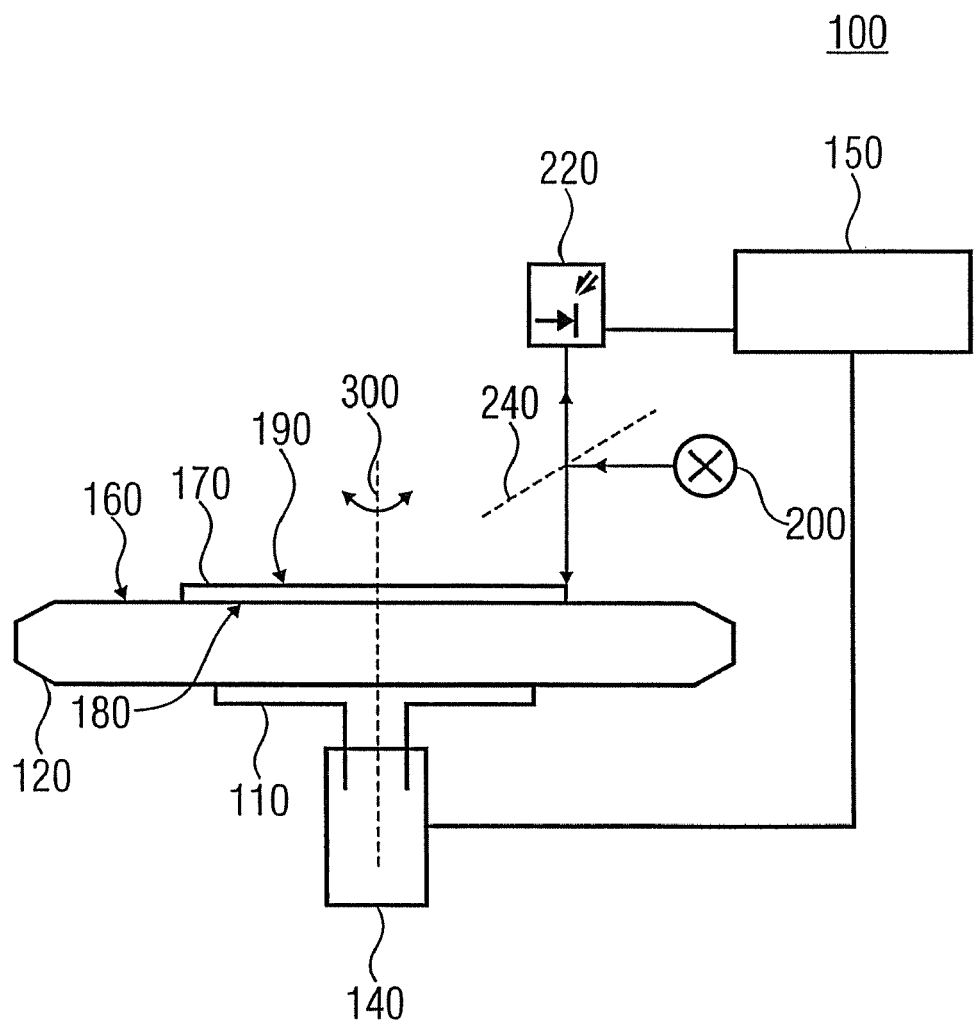
FIG. 3 illustrates a schematic illustration of a prealigner according to a second embodiment.

FIG. 3 illustrates another embodiment of a prealigner 100 according to the present invention which differs from the prealigner 100 illustrated in FIG. 1 only with regard to the electromagnetic radiation source, its arrangement and its optical path. While the electromagnetic radiation source 200 in the embodiment illustrated in FIG. 1 has been arranged with regard to the substrate 170 so as to directly illuminate the substrate, the substrate 170 in the embodiment illustrated in FIG. 3 is illuminated by a semi-transparent mirror 240 having a transparency greater than 0, but smaller than 1.

Depending on the specific implementation, the transmission intensity of the semi-transparent mirror 240 is in a range between 0.02 and 0.98, between 0.05 and 0.95, between 0.1 and 0.9 or between 0.25 and 0.75. Thus, the semi-transparent mirror 240 may be a semi-transmissive mirror with a transparency of around 0.50+/−0.05.

In addition, the semi-transparent mirror 240 is arranged such that the radiation emitted by the radiation source 200 hits the substrate 170 and/or its circumference basically perpendicularly. The optical/electrical converter 210, too, in the embodiment of a prealigner 100 illustrated in FIG. 3, is arranged such that it is arranged above the semi-transparent mirror, basically perpendicular above the substrate 170 and/or its circumference so that the result, with regard to the illumination optical path starting from the radiation source 200, is a coaxial optical path between the semi-transparent mirror 240 and the substrate 170 on the one hand and the radiation reflected back from the substrate 170 to the optical/electrical converter 210 on the other hand.

Put differently, this means that both the direction of illumination and the "direction of observation" of the optical/electrical converter 210 are basically along the same line and/or along the same direction which is basically perpendicular to the main 190 of the substrate 170, i.e. basically parallel to the respective normals to surface. As has been discussed before, basically perpendicular directions, axes and lines here are meant to be enclosing an angle of +/−15° or +/−5° with the respective area, surface or main surface.

Figure 4A:
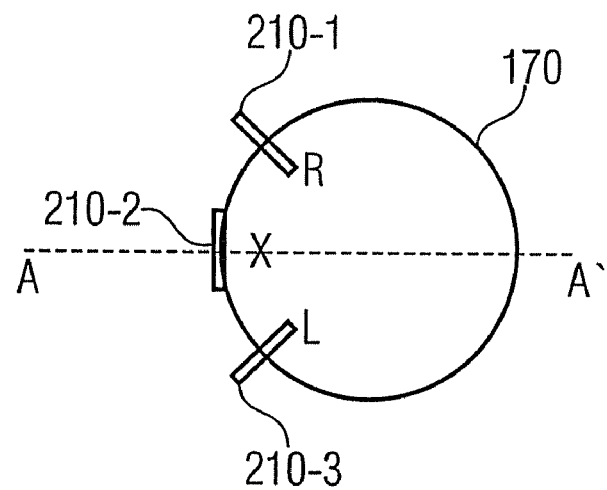
FIG. 4a illustrates a schematic arrangement of optical/electrical converters according to another embodiment.
Figure 4B:
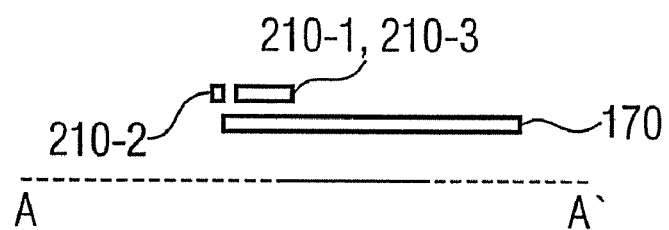
Figure 5:
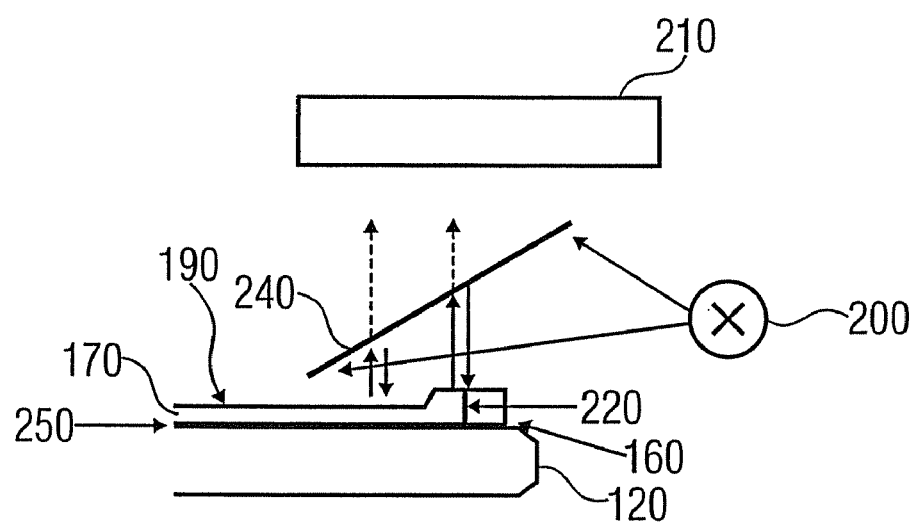
FIG. 5 illustrates a schematic partial cross-sectional illustration of a prealigner according to an embodiment.

FIGS. 4a, 4b and 5 illustrate partial views of one embodiment in form of a prealigner 100 having, in contrast to the embodiments illustrated in FIGS. 1 and 3, optical/electrical converters 210 embodied as line scan cameras with more than one optical/electrical conversion element. Here, FIG. 4a illustrates a top view onto the carrier 120, not illustrated in FIG. 4a, with the wafer 170 and altogether three optical/electrical converters 210-1, also referred to as camera R in FIG. 4a, an optical-electrical converter 210-2, also referred to as camera X in FIG. 4a, and an optional optical/electrical converter 210-3, referred to as L in FIG. 4a. The two optical/electrical converters 210-1 and 210-3 here are essentially oriented perpendicularly to the course of the circumference of the wafer 170, i.e. pass in radial direction with respect to a center of the wafer 170. In contrast hereto, the optical-electrical converter 210-2 is essentially oriented in parallel to a course of the circumference of the wafer 170, i.e. passes essentially in tangential manner with respect to the circumference of the wafer 170.

FIG. 4b illustrates a schematic cross-sectional drawing of the wafer 170 as well as of the three optical-electrical converters 210-1, 210-2, 210-3, wherein the two optical/electrical converters 210-1, 210-3 coincide due to the cross-section along the line A-A' drawn in FIG. 4a. The three optical/electrical converters 210-1, 210-2, 210-3 are line scan cameras including a plurality of optical/electrical conversion elements or optical/electrical converter elements aligned along a one-dimensional array.

More specifically, the one-dimensional arrays illustrated in FIG. 4a are arrays of the optical/electrical conversion elements along a straight line having the previously described orientation with respect to the circumference of the wafer 170. The optical/electrical conversion elements of the optical/electrical converters 210 may, for example, be photodiodes sensitive to the radiation emitted from the radiation source 200 (not illustrated in FIGS. 4a and 4b), CCD elements, CMOS elements, or other photosensitive or radiation-sensitive sensor elements, depending on the technology employed.

Such a line scan camera as optical/electrical converter 210 may, for example, have a length between 4 mm and 20 mm, for example 8 mm, in the case of a prealigner 100 for 8" wafers with typical notch dimensions in the range of about 1.5 mm.

FIG. 5 illustrates a schematic cross-sectional illustration through the prealigner already schematically illustrated in simplified manner in FIGS. 4a and 4b, according to one embodiment. More specifically, FIG. 5 here illustrates a cross-section, as already illustrated in FIG. 4b on a larger scale, in the region of one of the optical/electrical converters

210-1, 210-2, 210-3. In this context, it is to be noted that, in the embodiment illustrated in FIGS. 4*a*, 4*b* and 5, implementation of a third optical/electrical converter 210, more specifically the optical-electrical converter 210-3, is optional. Thus, implementation of the converter concerned or the associated radiation source 200 may be omitted, unless this seems to make sense or be necessary by implementation-specific preconditions.

The cross-section illustrated in FIG. 5 resembles the cross-sections illustrated in FIGS. 1 and 3, wherein functionally equal or functionally similar elements and units are again designated with the same reference numerals. Thus, FIG. 5 again illustrates a carrier 120 onto which a substrate 170 in form of a wafer with a notch 120 is glued, which is illuminated essentially perpendicularly in the area of the circumference of the wafer 170 via a semi-transparent mirror 240 and an electromagnetic radiation source 200. Above the semi-transparent mirror 240, a line scan camera or optical/electrical converter 210, which detects the radiation passing through the semi-transparent mirror and previously reflected at the main surface 190 of the substrate 170 or the main surface 160 of the carrier 120, again is arranged essentially perpendicularly above the circumference of the wafer 170. The wafer 170 may here be glued onto the carrier 120 (e.g., glass carrier) with the aid of a glue 250 also referred to as LTHC (light to heat connector).

So as to now perform a prealignment of the substrate 170, also referred to as intermediate product or product, with the prealigner illustrated in FIGS. 4*a*, 4*b* and 5, for example, at first the center of the wafer 170 may be moved to the rotation axis 130 (not illustrated in FIG. 5) of the rotor 110, using the three optical/electrical converters 210-1, 210-2, 210-3 disposed above the substrate 170, by shifting the carrier 120 with respect to the rotor 110 (also not illustrated in FIG. 5) in a plane that is essentially perpendicular to the rotation axis 130, for example. This may, for example, be done by the use of an optional optical-electrical converter 210-3 (camera L) locating the wafer 170.

If the center of the wafer 170 does not match with the rotation axis 130 of the rotor 110 within the scope of a construction-induced accuracy, for example, the optical-electrical converter 210 concerned detects movement of the wafer 170 along the alignment of the optical/electrical converter concerned, while the wafer 170 is rotating. If the center of the wafer 170 matches with the rotation axis 130 of the rotor 110 within the scope of the default accuracy, the optical-electrical converter 210-3 (camera L) no longer detects any signal changing periodically along its orientation, and/or only detects a corresponding signal the amplitude of which lies below a threshold.

The adjustment with respect to the center of the wafer 170 regarding the rotation axis 130 may, for example, be performed with the aid of an arrangement of a radiation source 200 together with an optical-electrical converter 210, as this is illustrated in FIG. 5, for example, but also in FIGS. 1 and 3. In one embodiment, however, such an adjustment may also take place based on a light source disposed below the wafer 170, using a transmitted-light principle, as far as the carrier 120 and the wafer 170 include a corresponding combination of transparent and/or non-transparent materials. If the carrier 120 is a glass carrier, and if the wafer 170 is a silicon wafer, for example, apart from the coaxial and/or incident illumination described within the scope of FIGS. 1, 3 and 5, there also is the possibility to perform this adjustment of the center of the wafer 170 with respect to the rotation axis 130, using the transmitted-light principle.

Following this pre-adjustment of the center of the wafer 170, for example, the notch 220 can be detected using the optical/electrical converter 210-1 (camera or line scan camera R), while the wafer 170 is rotating on the rotor 110 of the prealigner 100. If the notch 220 is found here, it can be positioned below the optical-electrical converter 210-2 (camera X) by corresponding control of the rotor 110, and a signal of the optical/electrical converter 210-2 can be captured.

If deemed necessary by the controller 150 (not illustrated in FIGS. 4*a*, 4*b*, 5) on the basis of the sensor signal of the optical/electrical converter 210-2, the wafer 170 may be re-adjusted with respect to the rotation around its center 170 and/or with respect to the rotation axis 130 of the rotor 110 within the scope of a fine alignment following the coarse alignment, using the optical/electrical converter 210-2.

If the sensor signal captured with the optical/electrical converter 210-2 (camera X) corresponds to a condition, which is hard-wired, programmable, adjustable or can be taken in another way within the scope of a process control software by a user or for example from a database, the controller 150 may generate a transportation signal upon which a transporter of a lithographical stepper may perform a transfer of the carrier 120, together with the wafer or substrate 170, onto a sample stage for the actual exposure by the stepper.

Depending on the particular implementation, the conditions previously mentioned are also referred to as algorithms due to a possible signal processing by using a digital signal processor (DSP). In connection with FIG. 10, a block circuit diagram of a photolithographic stepper according to one embodiment will be explained.

In other words, FIG. 5 schematically illustrates a principle illustration of a coaxial illumination in which the electromagnetic radiation source 200, which may also be referred to as light source and, for example, be embodied as a light-emitting diode (LED), and the optical/electrical converter 210, which is also referred to as line scan camera or camera, together are above the wafer 170, which is also referred to as intermediate product or product. The electromagnetic radiation, which is also referred to as light in the further course for simplification, is directed onto the topside or main surface 190 of the wafer 170 via a semi-transparent mirror 240, for example a semi-transmissive mirror. The reflected light is detected successively by the optical-electrical converters 210-3 (camera L), 210-1 (camera R) and 210-2 (camera X). Here, the radiation source 200 as well as the optical/electrical converters 210 may include further optical components, such as mirrors, lenses, apertures or similar components influencing the optical path.

For example, if the sensor signals correspond to the previously mentioned conditions and algorithms within the scope of a coarse pre-adjustment (coarse alignment) with the aid of the optical/electrical converter 210-1, a fine adjustment or fine alignment maybe performed subsequently with the aid of the optical/electrical converter 210-2 (camera X). The wafer 170 can then be moved onto the sample stage in the actual illumination region of the (photolithographic stepper) via a transporter. Depending on the specific implementation, in this connection, it may be advisable to implement a signal processing circuit formed to amplify, invert, filter, differentiate, integrate, subtract an offset from or shape the signal shape or waveform of the sensor signal or signals of one or more optical/electrical converters 210. Shaping a waveform may, for example, include setting the signal values to a first predetermined value (e.g., a maximum signal value) if the signal value concerned exceeds a predetermined lower limit. Correspondingly, shaping a waveform may also include setting a signal value to a second predetermined signal value (e.g., a smallest signal value) if the signal value concerned falls below a predetermined upper limit. Of course, also combinations of various signal processings may be employed, i.e. for example an inversion of a sensor signal, followed by a filtering and/or de-noising and ensuing signal shaping. Other combinations are possible.

Depending on the particular implementation of a prealigner 100, it may, for example, be advisable to maybe invert individual sensor signals as a matter of principle, for example if the arrays of the light sources 200 and the optical/electrical converters 210 illustrated in FIGS. 1, 3 and 5 and described in this connection on the one hand, and a corresponding configuration according to the transmitted-light principle are commonly employed, since in this case an inversion of the individual waveforms of the sensor signals may occur due to the different illumination principles. Hence, so as to enable uniform signal processing, it may well be advisable in these cases to invert individual signals, for example these of the optical/electrical converters 210 operating according to the coaxial illumination principle, so as to be compatible with sensor signals obtained with the aid of a transmitted-light illumination array.

In other words, in the case of the optical/electrical converters 210-1 (camera R) and 210-2 (camera X) including an array according to the principle of the coaxial illumination from FIG. 5, inversion of the sensor signals concerned of these two optical/electrical converters 210 may be advisable so as to take advantage of the good contrast enabled by the coaxial illumination on the one hand, and at the same time obtain a waveform compatible with transmitted-light sensors potentially present. As already illustrated by the previous discussion, this may, for example, be the case with a glass carrier 120 and a silicon wafer as substrate 170.

Moreover, there is the possibility of rendering sensor signals corrupted by a specification violation or other error sources, by employing a signal processing circuit, such that they correspond to the required algorithms. Thus, if disturbances of the signals detected by the optical/electrical converters 210 occur, caused by heavy specification violations in the notch area, for instance, these disturbances may be rendered by using a digital signal processor (DSP) or other signal processing circuits, means and components so that they correspond to the required algorithms of the controller 150. This can then initiate the transportation signal for the transportation of the carrier 120, together with the substrate 170, from the prealigner 100 to the sample stage of the stepper, for example. Simpler signal processings, such as smoothing and inversion of the signals, may also be realized by analog hardware components, digital signal processors or other signal processing means.

A prealigner, as it is illustrated within the scope of FIGS. 4a, 4b and 5, for example, thus for example enables the prealignment or alignment of wafers 170 for example bonded on glass at the prealigner 100. Here, the alignment includes the alignment of a notch or a flat with respect to the angle, and a centering with respect to an X-axis and a Y-axis, i.e. a shift in a plane essentially perpendicular to the rotation axis with respect to the rotation.

As will be explained further subsequently, embodiments according to the present invention with coaxial illumination and maybe an optional signal manipulation thus enable to provide applicable, production-suited contrast conditions, which create a precondition for the above-mentioned adjustment or pre-adjustment under production-suited boundary conditions. Potential advantages resulting through the employment of the principle of the coaxial illumination and maybe an additional integrated signal processing by using a digital signal processor (DSP) or other signal processing circuits and means are explained in connection with FIGS. 6 to 9. Here, for example, the contrast conditions resulting by the use of the coaxial illumination are discussed in comparison with these seen in case of a transmitted-light illumination.

Figure 6:
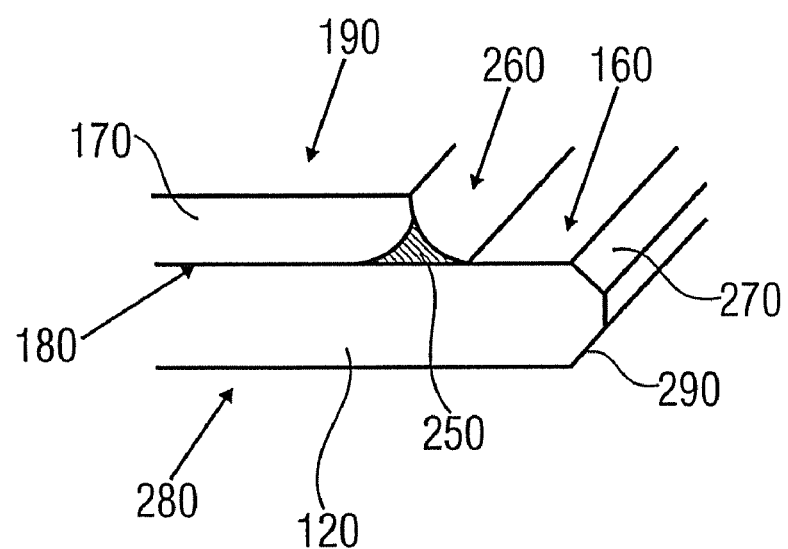
FIG. 6 illustrates a schematic illustration of a carrier including a substrate.

FIG. 6 schematically illustrates the reproduction of a scanning electron microscope image of a substrate 170 with a backside 180 and its main surface 190, which is glued onto a glass carrier as carrier 120 with the aid of a glue. Parts of the glue 250 are reproduced in the area of an edge 260 of the substrate 170.

In the area of the main surface 160, the carrier 120 includes a chamfer 270. Moreover, the carrier 120 also includes a further chamfer 290 opposite the chamfer 270 with respect to the backside 280 facing away from the main surface 160. Since the wafer is also referred to as product, FIG. 6 also illustrates a product edge of a product bonded onto a glass carrier.

Figure 7:
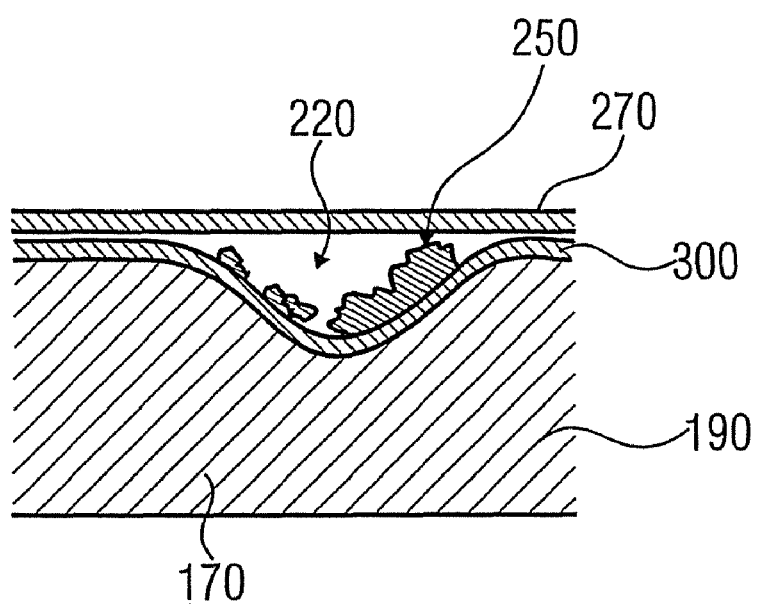
FIG. 7 illustrates a schematic top view of a notch of a wafer with transmitted light.

FIG. 7 schematically illustrates a transmitted-light capture of an area around a notch 220 of a wafer 170. The hatching in FIG. 7 here illustrates the contrast conditions in a corresponding capture. This is a top view onto the main surface 190 of the wafer 170, which is a silicon wafer again glued onto a glass carrier 120. Due to the fact that this is a transmitted-light capture in which the radiation source 200 or light source (e.g., LED) illuminates the carrier 120 and the substrate 170 from the backside 280 of the carrier 120, while the optical/electrical converter 210 (line scan camera) as well as the rest of the system are arranged on the side facing the two main surfaces 190, 160, the main surface 190 appears dark in FIG. 7.

Due to this illustration, the notch 220 itself appears light, because in this area the light of the radiation source 200 can pierce the glass carrier 120 and reach the optical/electrical converter 210. Moreover, the chamfer 270 illustrated in FIG. 6, also can be seen in FIG. 7, which also illustrates as a dark stripe in the image.

In the area of the notch 220, a disturbance of the contrast conditions, as illustrated in FIG. 7, develops by remainders of the glue 250 escaping into the notch area 220 below the area of the wafer 170. Since these glue remainders, also referred to as LTHC (light to heat connector) remainders, also have significantly lower transparency, like the wafer 170, in comparison with the glass carrier 120, these also appear as dark in the transmitted-light capture, as it is schematically illustrated in FIG. 7.

Especially due to such glue remainders, which escape into the area of the notch 220, it may happen that an optical/electrical converter 210, such as the optical-electrical converter 210-1 (camera R), as it is illustrated in FIG. 4a and used for the coarse prealignment of the substrate, the notch 220 cannot be recognized as such. This may result in the fact that, as opposed to the above-mentioned description, no rotation of the wafer to the optical/electrical converter 210-2 (camera X) takes place. In such a case, the wafer 170 concerned could not be processed further, which might lead to a halt of the production line or facility.

But even if the notch 220 is recognized by the optical/electrical converter 210-1 (camera R) within the scope of the coarse pre-adjustment, additional disturbances of the sensor signal of the optical-electrical converter 210-2 (camera X) may result, since this also cannot definitely identify the notch as such and correspondingly align the wafer due to the glue remainders escaped into the notch area. In this case, it may also happen that the facility halts and no transportation of the wafer onto the sample stage of the stepper takes place. In this case, production may also not be possible.

A further potential source of disturbance lies in an edge area 200 of the wafer 170, in which an irregularity with respect to the shape of the notch 200 may arise for example by flaked-off pieces of the substrate material. In such a case, problems with automatic recognition of the notch 220 or another mark may arise within the scope of the coarse pre-alignment or within the scope of the fine prealignment, which may again lead to a halt of the production facility or a discard of the wafer 170 concerned.

Figure 8:
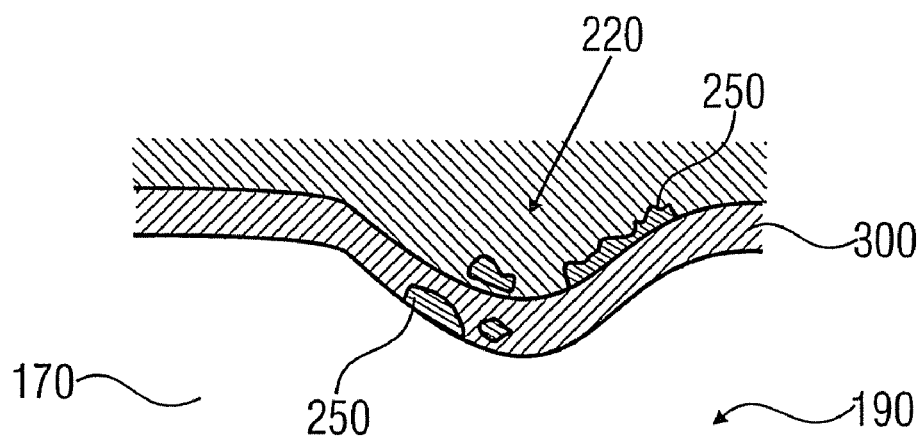
FIG. 8 illustrates a schematic top view of a notch in the case of a prealigner according to an embodiment.

FIG. 8 illustrates a schematic illustration of the notch area 220 in case of an incident-light illumination and/or in the case of a coaxial illumination, according to one embodiment. FIG. 8 also again illustrates a silicon wafer as substrate 170, which is bonded onto a glass carrier 120 with the aid of a glue, as this is illustrated schematically in FIG. 6. Due to the illumination conditions in the case of the coaxial illumination, in which the radiation source 200 illuminates the main surface 190 of the substrate 170 and in which the optical/electrical converter 210 detects the light reflected from the main surface 190 and/or the reflected radiation, the contrast conditions and contrasts in the area of the notch 220 result, as indicated by the hatching in FIG. 8.

Due to the illumination of the main surface 190 of the substrate 170 with the electromagnetic radiation, i.e. for example with visible light, it appears as light in case of using the coaxial illumination principle according to one embodiment, as this is illustrated in FIG. 8. In contrast hereto, for example, the area of the carrier 120 appears dark, since this is a glass carrier in the example underlying FIG. 8, so that the radiation emitted from the radiation source may pierce same downward. For this reason, in the illustration illustrated in FIG. 8, the optical/electrical converter 210 is not capable of detecting high intensity of the reflected radiation in the area of the notch 220.

This also applies for glue remainders 250 and for the edge area 300, as this is illustrated in FIG. 8, since in the case of both disturbances the reflectivity clearly lies below the main surface 190 of the substrate 170. Thus, in the case of the glue 250 as well as in the case of the edge area 300, the light incident on these areas is diffusely reflected away from the optical/electrical converter 210 or partially absorbed into same.

This leads to the fact that only a small contrast between the edge area 300, escaped glue remainders 250 and the actual area of the notch 220 remains in comparison with the radiation reflected at the main surface 190 of the substrate, so that a secure and hence more production-suited automatic detection of the position of the notch 220 becomes possible.

For completeness sake, it is to be mentioned at this point that due to a slight reflection at the main surface 160 of the glass carrier 120 this may appear as slightly lighter than for example the edge area 300 or the glue remainders 250. This reflection at the main surface 160 of the carrier 120, which may, for example, occur in the area of the notch 220, however, mostly is significantly smaller than the reflection at the main surface 190 of the substrate 170, so that it plays a minor role.

Figure 9:
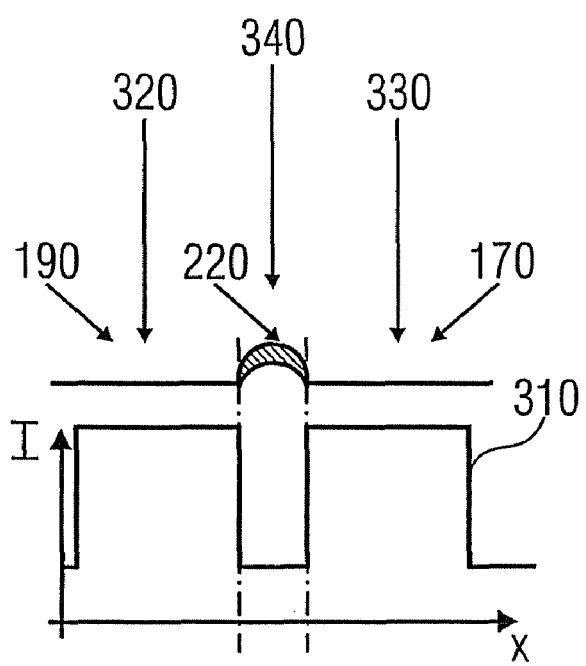
FIG. 9 illustrates a schematic waveform obtainable at an optical/electrical converter in the case of a prealigner according to an embodiment.

FIG. 9 schematically illustrates a possibly already shaped waveform of an intensity I as a function of a space coordinate x, as it may, for example, be registered by the optical/electrical converter 210-2 (camera X). Above the waveform 310, a wafer or rather circumference is illustrated schematically as substrate 170 with a notch 220, which leads to the waveform 310 illustrated therebelow in FIG. 9.

Thus, the main surface 190 of the substrate 170, in a first area 320 and in a second area 330, reflects the light emitted from the radiation source onto the main surface 190, so that the optical/electrical converter 210 registers high intensity I in these two areas. In a third area 340 lying between the first and second areas 320, 330 and including the notch 220 of the wafer, however, the light pierces the carrier below exposed by the notch 220, so that the reflection, and hence the intensity detected by the optical/electrical converter 210, is substantially lower.

Figure 10:
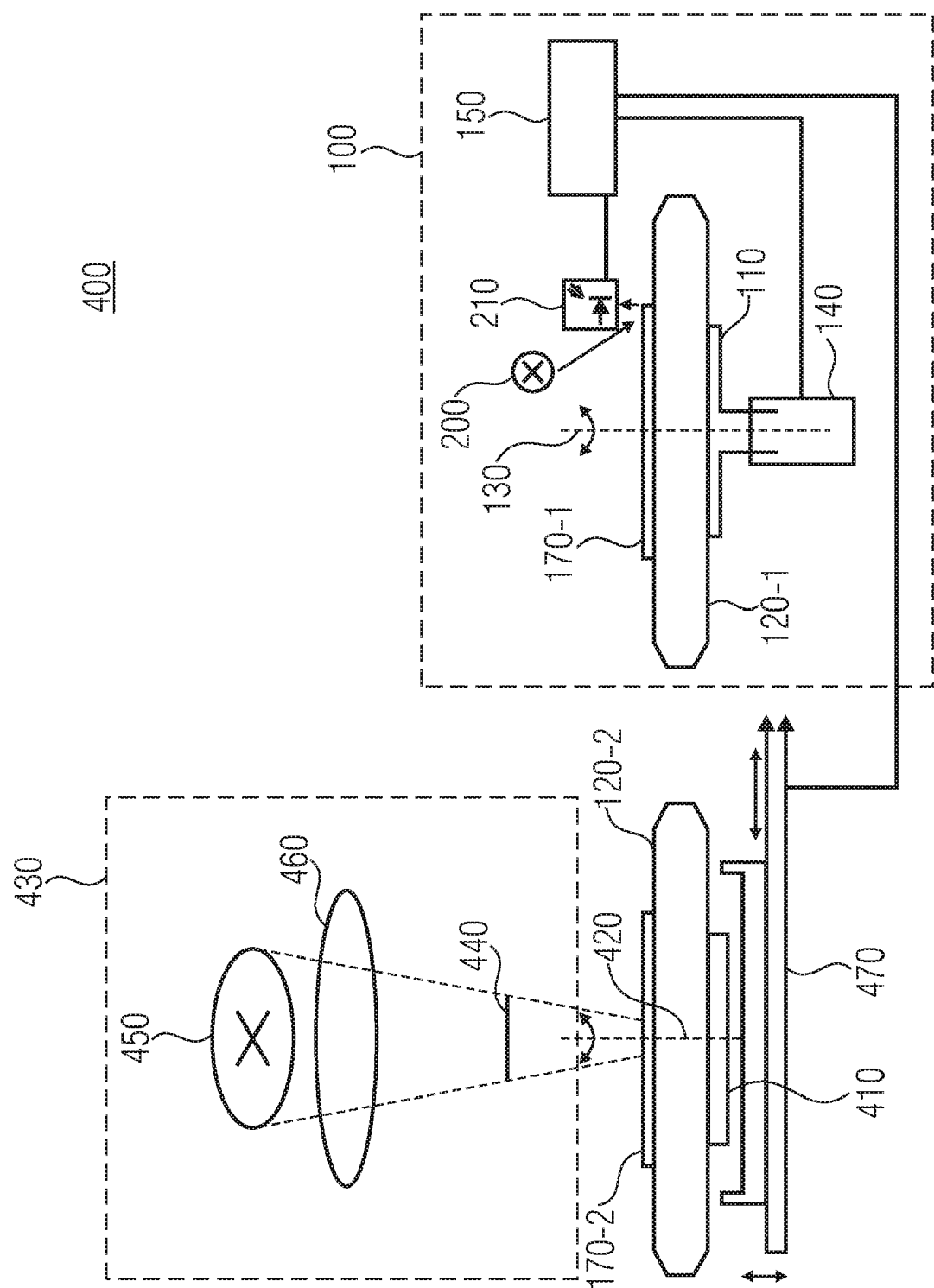
FIG. 10 illustrates a schematic illustration of a photolithographic stepper according to an embodiment.

FIG. 10 schematically illustrates an exposure system in form of a photolithographic stepper 400 according to one embodiment. The stepper 400 includes a prealigner 100, as described in connection with FIG. 1 or 3 or in connection with FIGS. 4a, 4b and 5, for example. The stepper 100 thus again includes a rotor 110 with a drive unit 140, as well as an electromagnetic radiation source 200, an optical/electrical converter 210 and a controller 150, on the one hand coupled to the drive unit 140 and/or the rotor 110 to make a rotation signal available for the same. Moreover, the controller 150 also is coupled to the optical/electrical converter 210 in order to receive a sensor signal therefrom.

Here, FIG. 10 schematically illustrates that a carrier 120-1 rests on the rotor 110 of the prealigner 100 and/or is connected to the same, on which again a substrate 170-1 is connected for prealignment. The substrate 170-1 may here for example be glued or otherwise deposited to the carrier 120-1.

Furthermore, the stepper 400 includes a sample stage 410 formed so as to rotate a carrier 120-2, on which a substrate 170-2 is mountable, with respect to a further rotation axis 420, also referred to as second axis. Moreover, the sample stage 410 is formed so as to move the carrier 120-2 together with the substrate 170-2 in a plane essentially perpendicular to the further rotation axis 420. The further rotation axis 420 and the rotation axis 130 of the prealigner 100 here are essentially parallel. The sample stage may here for example include a fixture for the carrier 120 and/or the substrate 170, which is also referred to as a chuck.

The stepper 400 further includes a projector 430 formed so as to project a pattern of a reticle or mask 440 onto the main surface of the substrate 170-2 facing the projector. Depending on the particular implementation, the projector 430 thus includes a further radiation source 450 and an optical system 460 for influencing the course of the radiation of the further radiation source 450. In FIG. 10, the optical system 460 is illustrated as a single convergent lens in simplifying manner, but may of course include a multiplicity of other components, such as divergent lenses, convergent lenses, apertures, prisms, mirrors, semi-transparent mirrors and other optical elements.

Moreover, the stepper 400 include a transporter 470 coupled to the controller 150 to receive a transportation signal, so that this transfers a carrier 120 together with a substrate 170 prealigned in the prealigner 100 onto the sample stage 410. The transporter 470 here is schematically illustrated in FIG. 10 as a transportation belt, in which the transportation of the carrier 120 from the rotor 110 to the sample stage 410 is realized by lifting and a mechanical driving around. Of course, other realizations of a transporter 470 are also possible, in which for example the substrate 170 together with the carrier 120 is transported from the rotor 110 to the sample stage 410 not by a linear motion but by a rotation. In both cases, for example, a mechanical decoupling of the carrier 120 from the rotor 110, as well as a mechanical coupling of the carrier 120 to the sample stage 410, may take place by lifting or lowering the carrier 120 concerned. Electrostatic, magnetic or pneumatic couplings and decouplings are also possible.

Moreover, the sample stage 410 may, for example, be coupled to a further controller not illustrated in FIG. 10, to perform the alignment and exposure briefly outlined in the following. Of course, the further controller may in one embodiment also be part of the controller 150 of the prealigner. In this case, for example, the controller 150 may also be coupled to the sample stage 410 to be able to communicate corresponding signals to the sample stage.

Following transportation of a carrier 120 with the substrate 170 mounted thereon to the rotor 110 of the prealigner 100, the substrate, together with the carrier 120, is at first aligned so that a mark of the substrate 170, i.e. for example a notch or a flat, is aligned with respect to the optical/electrical converter 210 by the prealigner 100 in a single-stage or multi-stage embodiment of an prealignment method. Then, the carrier 120, together with the prealigned substrate 170, is transported from the rotor 110 to the sample stage 410 via the transporter 470. Thereupon, the prealigner 100 is again available for renewed prealignment of a carrier 120 with a further substrate 170.

As already described in connection with FIGS. 1 to 5, in one or more embodiments in form of a prealigner 100, the Prealigner 100 is capable of aligning the substrate 170 independently of an original orientation by for example the rotor 110 being formed to be rotatable by +/−180° at least with respect to a designated direction. In contrast hereto, the sample stage 410 indeed often also enables rotation and movement of the carrier 120 together with the associated substrate 170, but with the rotation range of the sample stage 410 typically being limited to an angle range of less than +/−30°, and in many cases to a range of less than +/−5°, so that especially prealignment, starting from an arbitrary orientation of the substrate 170 together with the carrier 120, is not possible via the sample stage 410. Instead, the sample stage 410 optionally enables to compensate deviations in orientation occurred in the transportation by the transporter 470 and/or even to perform a finer orientation by the sample stage 410 itself again being movable by a movement in the plane perpendicular to the further rotation axis 420 and also being rotatable around this rotation axis 420.

For performing exposure, after a first alignment of the carrier 120 with the substrate 170 and a further alignment possibly performed for each write field individually, a write field is projected onto the main surface of the substrate 170 via the optical system 460, wherein the radiation of the further radiation source 450 passes the reticle 440 and thus projects an often shrunk version of the structure on the reticle 440 onto the main surface of the substrate 170. After a first write field has been exposed in this way, the sample stage 410 can be moved correspondingly in the plane perpendicular to the further rotation axis 420 to reach a further write field area. There, maybe after a further fine alignment, the reticle 440 may again be projected onto the main surface of the substrate 170.

During this exposure, one or more substrates 170 can be prealigned by the prealigner 100 in the above-described manner.

UV (ultraviolet radiation) sources are often employed as further radiation source 450 in the field of photolithographic steppers 400. Examples employ mercury-vapor lamps (Hg vapor lamps) and other light sources, such as excimer lasers (e.g., KrF). Depending on the further radiation source 450 used, it may be required to adapt the optical system 460 with respect to the materials and technologies used. Likewise, an adaptation of the reticle 440 to the further radiation source 450 used may also be advisable.

As also indicated in FIG. 10, in projection exposure system, such as the photolithographic stepper 400, for example, often a shrunk image of the structure of the reticle is projected onto the substrate 170. Typically, the structures here are shrunk by a factor ranging from 1 to 10 with respect to a dimension. However, this is no required prerequisite, since also projection exposure system or contact exposure system, also referred to mask aligners, can be used without shrinking, i.e. as an illustration on the 1:1 scale, for example. Steppers, projection exposure system, contact exposure system and other exposure means collectively also are referred to as exposure systems.

Apart from the various forms of embodiments according to the present invention mentioned already within the scope of the description, of course two-dimensional arrays of optical/electrical conversion elements further may be employed within the scope of the optical/electrical converters. One or more embodiments thus are not limited to individual optical/electrical conversion elements or to one-dimensional arrays of optical/electrical conversion elements. Thus, for example, by implementation of a two-dimensional optical/electrical converter 210, more rapid prealignment of the substrate 170 within the scope of the prealigner 100 may take place.

Moreover, of course, already existing photolithographic steppers and other projection and contact exposure system may also be improved with respect to the technical possibilities at hand with the aid of one or more embodiments. Thus, one or more embodiments are suited for a multiplicity of substrates and carriers. Thus, for example, one embodiment in form of a prealigner may basically open up at all the possibility to adjust a bonded wafer on a photolithographic stepper. In particular, embodiments may offer the possibility to perform such a prealignment quickly, safely and efficiently, so that production-suited boundary conditions can be achieved.

Corresponding embodiments for example, are applicable in the field of bonded products, in which it may be advisable to pre-adjust or prealign these on a prealigner. Thus, embodiments may be employed in an i-line stepper of the Canon Company, in order to make corresponding bonded products and wafers accessible to prealignment or adjustment. Embodiments may thus also be applied to existing devices of an equipment park.

Moreover, as already indicated above within the framework of the discussion of the possibility of the signal processing, by corresponding preprocessing and adaptation of the signals with respect to signal strength etc. and an inversion possibly conducted, a prealigner according to one embodiment can be configured to already existing control electronics and control devices of corresponding photolithographic steppers or other illumination devices.

In other words, for example, by a corresponding signal processing circuit, one embodiment in form of a prealigner 100 can be attached to a corresponding control circuit of a photolithographic stepper (e.g., Canon board).

The circuits and controllers mentioned, for example the controller 150, can be implemented both based on discrete electrical and electronical devices, and also in form of integrated circuits, computer-based with the aid of one or more processors or as a combination of these. Depending on the particular implementation and requirement specification, the procedural processes concerned may be made in software for example by reading out registers, determining a voltage level, determining a current level via corresponding sensors, or by reading out a sensor in analog or digital manner. Depending on the particular implementation, this may be reading out a memory address, a variable or another designator. The programs concerned may, for example, be filed in corresponding memories as firmware or other programs.

Depending on the conditions, embodiments of methods according to the invention may thus be implemented in hardware or in software. The implementation may be on a digital storage medium, for example a floppy disk, CD or DVD, with electronically readable control signals capable of cooperating with a programmable computer system so that an embodiment of a method according to the invention is executed. In general, one or more embodiments thus also consist in a software program product and/or a computer program product and/or a program product with a program code stored on machine-readable carrier for performing an embodiment of a method according to the invention, when the software program product is executed on a computer or a processor. In other words, the invention thus may also be realized as a computer program and/or software program and/or program with a program code for performing an embodiment of a method, when the program is executed on a processor. The processor may here be formed by a computer, a chip card (smart card), a digital signal processor (DSP), an ASIC (application specific integrated circuit), or another integrated circuit.

While the previous descriptions have been explained in particular with reference to the described embodiments, it is obvious to a person skilled in the art that numerous modifications with respect to the form and further details can be performed, without departing from the underlying concept and the object thereof. It therefore goes without saying that a multiplicity of modifications with respect to various embodiments can be performed, without departing from the wider concept, which is disclosed in this description, and to let oneself be guided by the understanding of the following claims.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system for making an integrated circuit including a prealigner for aligning a substrate, comprising:
 a rotor configured to rotate a carrier, around a rotation axis, in response to a rotation signal;
 wherein the carrier comprises a main surface substantially perpendicular to the rotation axis;
 wherein the substrate is disposable on the carrier; and
 wherein the substrate comprises a backside facing the carrier, an opposing main surface facing away from the carrier, and a mark such that an orientation of the substrate with respect to the rotation axis is detectable;
 an electromagnetic radiation source configured to illuminate the main surfaces of the substrate and the carrier with electromagnetic radiation;
 an optical/electrical converter being responsive to the electromagnetic radiation reflected back from the main surfaces of the carrier and the substrate for detecting the mark of the substrate and providing a sensing signal; and
 a controller configured to receive the sensing signal and providing the rotation signal.

2. The system of claim 1, comprising wherein the prealigner is configured to align the substrate independent of an initial orientation of the substrate.

3. The system of claim 1, comprising wherein the carrier is rotatable at least by +/−180°.

4. The system of claim 1, comprising wherein the carrier comprises a different reflectivity than the substrate.

5. A system for making an integrated circuit including a prealigner for aligning a substrate, comprising:
 a rotor configured to rotate a carrier, around a rotation axis, in response to a rotation signal;
 wherein the carrier comprises a main surface substantially perpendicular to the rotation axis;
 wherein the substrate is disposable on the carrier; and
 wherein the substrate comprises a main surface and a mark such that an orientation of the substrate with respect to the rotation axis is detectable;
 an electromagnetic radiation source configured to illuminate the main surfaces of the substrate with electromagnetic radiation;
 an optical/electrical converter being responsive to the electromagnetic radiation reflected back from the main surface, detecting the mark of the substrate and providing a sensing signal; and
 a controller configured to receive the sensing signal and providing the rotation signal;
 wherein the carrier comprises a different reflectivity than the substrate, and wherein the substrate is disposable on the carrier by glue and the glue comprises a different reflectivity than the substrate.

6. The system of claim 1, comprising wherein the carrier comprises glass.

7. The system of claim 1, comprising wherein the electromagnetic radiation source is configured such that the electromagnetic radiation emitted by the electromagnetic radiation source illuminates the main surface of the substrate essentially perpendicularly.

8. The system of claim 1, wherein the electromagnetic radiation source comprises a semi-transparent mirror arranged above the main surface such that at least a fraction of the electromagnetic radiation emitted by the electromagnetic radiation source illuminates the main surface of the substrate essentially perpendicularly.

9. The system of claim 1, comprising wherein the electromagnetic radiation source is configured to emit visible light or infrared radiation as the electromagnetic radiation.

10. The system of claim 1, wherein the optical/electrical converter comprises at least a one-dimensional array of optical electrical converter elements.

11. The system of claim 10, comprising wherein the one-dimensional array of optical electrical converter elements is essentially oriented parallel to or perpendicularly to a circumference of a substrate in a plane above the main surface of the substrate.

12. The system of claim 1, further comprising a signal processing circuit for at least one of amplifying, subtracting an offset from, inverting, filtering, differentiating, integrating and shaping the sensing signal.

13. The system of claim 1, comprising wherein the controller is configured to generate the rotation signal in response to the sensing signal such that the mark is aligned with respect to the optical/electrical converter.

14. The system of claim 1, comprising wherein the prealigner is capable of moving the carrier in a plane essentially perpendicular to the rotation axis.

15. The system of claim 1, wherein the optical/electrical converter comprises at least a one-dimensional array of optical/electrical converter elements and wherein the prealigner further comprises a further optical/electrical converter comprising at least a further one-dimensional array of optical/electrical converter elements, wherein the one-dimensional array of optical/electrical converter elements is arranged essentially perpendicularly to a circumference of the substrate in a plane above the main surface of the substrate, and wherein the further optical/electrical converter is arranged essentially parallel to the circumference of the substrate in the plane above the main surface of the substrate or a further plane above the main surface of the substrate.

16. The system of claim 15, comprising wherein the controller is capable of a coarse first alignment of the substrate based on the sensing signal provided by the optical/electrical converter, and wherein the controller is capable of a fine second adjustment of the substrate based on a further sensing signal provided by the further optical/electrical converter.

17. The system of claim 1, comprising wherein the prealigner is configured such that the substrate is a wafer and the mark is at least one of a notch and a flat.

18. The system of claim 1, comprising wherein the prealigner is a prealigner for a photolithographic stepper.

19. A system comprising:
a prealigner comprising:
a rotor configured to rotate a carrier, around a rotation axis, in response to a rotation signal;
wherein the carrier comprises a main surface essentially perpendicular to the rotation;
wherein the substrate is disposable on the carrier; and
wherein the substrate comprises a main surface and a mark such that an orientation of the substrate with respect to the rotation axis is detectable;
an electromagnetic radiation source configured to illuminate the main surface of the substrate with electromagnetic radiation;
an optical/electrical converter being responsive to the electromagnetic radiation reflected back from the main surface, detecting the mark of the substrate and providing a sensing signal; and
a controller configured to receive the sensing signal and providing the rotation signal;
a sample stage capable of rotating around a further rotation axis and moving in a further plane substantially perpendicular to the further rotation axis, wherein the further rotation axis is substantially parallel to the rotation axis;
a transporter capable of transporting the carrier from the rotor onto the sample stage; and
a projector configured to project a pattern of a reticle onto the main surface of the substrate, when the carrier and the substrate is on the sample stage.

20. The system of claim 19, comprising wherein the prealigner is configured to align the substrate independent of an initial orientation of the substrate.

21. The system of claim 19, comprising wherein the sample stage is configured such that the rotating the carrier is limited to +/−30°.

22. The system of claim 19, comprising wherein the controller is capable of providing a transportation signal to the transporter after a successful alignment of the substrate by the prealigner indicating to transport the carrier with the substrate onto the sample stage.

23. A prealigning apparatus for prealigning a substrate, comprising:
means for rotating a carrying means, around a rotation axis, in response to a rotation signal;
wherein the carrying means comprises a main surface substantially perpendicular to the rotation axis;
wherein the substrate is disposable on the carrying means; and
wherein the substrate comprises a backside surface facing the carrying means, an opposing main surface facing away from the carrying means, and a mark such that an orientation of the substrate with respect to the rotation axis is detectable;
means for emitting electromagnetic radiation and for illuminating the main surface of the substrate with electromagnetic radiation;
means for detecting the electromagnetic radiation reflected back from the main surfaces of the carrying means and the substrate for detecting the mark of the substrate and for providing a sensing signal; and
means for receiving the sensing signal and for providing the rotation signal.

24. A method for making an integrated circuit including a prealigning a substrate on a carrier comprising:
defining the carrier to comprise a main surface substantially perpendicular to a first axis, wherein the substrate is disposable on the carrier, and wherein the substrate comprises a backside surface facing the carrier, an opposing main surface facing away from the carrier, and a mark such that an orientation of the substrate with respect to the first axis is detectable;
rotating the carrier around the first axis in response to a rotation signal;
illuminating the main surface of the substrate with electromagnetic radiation;
detecting the electromagnetic radiation reflected back from the main surfaces of the carrier and the substrates;
detecting the mark of the substrate and providing a sensing signal; and
generating the rotation signal based on the sensing signal.

25. A computer-readable storage medium storing computer-executable instructions for performing a method for prealigning a substrate on a carrier wherein the carrier comprises a main surface substantially perpendicular to a first axis, wherein the substrate is disposable on the carrier, and wherein the substrate comprises a backside surface facing the carrier, an opposing main surface facing away from the carrier, and a mark such that an orientation of the substrate with respect to the first axis is detectable, comprising:
rotating the carrier around the first axis in response to a rotation signal;
illuminating the main surface of the substrate with electromagnetic radiation;
detecting the electromagnetic radiation reflected back from the main surfaces of the carrier and the substrate;
detecting the mark of the substrate and providing a sensing signal; and
generating the rotation signal based on the sensing signal.

* * * * *